United States Patent

Huang et al.

[11] Patent Number: 6,133,755
[45] Date of Patent: Oct. 17, 2000

[54] INPUT/OUTPUT BUFFER WITH REDUCED RING-BACK EFFECT

[75] Inventors: Jincheng Huang, Taipei; Yuantsang Liaw, Taichung; Ching-Fu Chuang, Taipei, all of Taiwan

[73] Assignee: VIA Technologies, Inc., Taipei Hsien, Taiwan

[21] Appl. No.: 09/136,751

[22] Filed: Aug. 19, 1998

[30] Foreign Application Priority Data

Apr. 20, 1998 [TW] Taiwan ................................. 87105991

[51] Int. Cl.$^7$ .............................................. H03K 19/0175
[52] U.S. Cl. .................... 326/83; 326/86; 326/30
[58] Field of Search .................. 326/82, 83, 86, 326/26, 27, 30, 112, 119, 121

[56] References Cited

U.S. PATENT DOCUMENTS 5,793,222  8/1998  Nakase ....................................... 326/27

*Primary Examiner*—Michael Tokar
*Assistant Examiner*—A. Tran
*Attorney, Agent, or Firm*—Thomas, Kayden, Horstemeyer & Risley

[57] ABSTRACT

An input/output (I/O) buffer with reduced ring-back effect is provided. This I/O buffer is designed for a data transmission bus, such as a GTL+bus, for the transmission of a high-frequency and low-swing data signal. This I/O buffer is designed for the purpose of reducing the undesirable ring-back effect in the I/O buffer. The I/O buffer is characterized by the provision of a variable-resistance device that is connected between the system voltage and the input end of the I/O buffer. The system voltage is set to be equal in magnitude to the high-voltage logic state of the data signal received by the I/O buffer from the data transmission bus. When the input data signal is higher in magnitude than a preset reference voltage, i.e., at the high-voltage logic state, the variable-resistance device is switched to a low resistance value; on the other hand, when the data signal is lower in magnitude than the reference voltage, the variable-resistance device is switched to a near-infinity resistance value. In both cases, no current will flow through the variable-resistance device. This feature can help reduce the ring-back effect in the I/O buffer and also allows the benefits of low power consumption and reduced layout area on the circuit board as compared to the prior art.

19 Claims, 2 Drawing Sheets

& 1

INPUT/OUTPUT BUFFER WITH REDUCED RING-BACK EFFECT

CROSS-REFERENCE TO RELATED APPLICATION

This application claims the priority benefit of Taiwan application serial no. 87105991, filed Apr. 20, 1998, the full disclosure of which is incorporated herein by reference.

BACKGROUND OF THE INVENTION

1. Field of the Invention

This invention relates to input/output (I/O) buffers, and more particularly, to an I/O buffer with a reduced ring-back effect, which is specifically designed for use in conjunction with a data transmission bus with high-frequency and low-swing data signals.

2. Description of Related Art

With advances in semiconductor technologies, today's integrated circuits are fabricated into higher integration with low power consumption and high-speed operation. As a result, data transmission buses between the various integrated circuits in computer systems are subjected to the transmission of high-frequency and low-swing data signals. One data transmission bus of this type includes, for example, the GTL+bus.

FIG. 1 is a schematic diagram showing the configuration of a conventional GTL+bus. As shown, the conventional GTL+bus includes a first GTL+I/O buffer IC 1, a second GTL+I/O buffer IC2, a first transmission line 10, a second transmission line 12, and a termination resistor $r_{t1}$ (which is typically 50 Ω in resistance). The termination resistor $r_{t1}$ has one end connected to a system voltage $V_{tt}$ and the other end connected to the second transmission line 12. The other end of the second transmission line 12 is connected to both the IC1 and the first transmission line 10; the other end of the first transmission line 10 is connected to the IC2.

When the IC1 serves as the input end and the IC2 serves as the output end, the ring-back effect in the I/O buffer is insignificant because the IC1 at the input end is close to the termination resistor $r_{t1}$. On the other hand, because no termination resistor is provided near the IC2, when the IC2 serves as the input end and the IC1 serves as the output end, an undesired ring-back effect is evident at node 16, located between the IC2 and the transmission line 10.

The ring-back effect on the input data signal to the IC2 at the node 16 is illustrated in FIG. 2. As shown, when the input data signal is switched from 1.5 V (i.e., the high-voltage logic state) to $V_{OL}$ (i.e., the low-voltage logic state, which is about 0.2 V), a bounce-back occurs in the waveform at the point 18 near $V_{OL}$ due to the ring-back effect. The voltage level of the bounce-back point 18 can be as high as 0.8 V which is very close to the reference voltage $V_{ref}=1.0$ V. The logic value of the output of the I/O buffer can thus be affected.

A conventional solution to the foregoing problem, as illustrated in FIG. 1, is to connect a transmission line 14 to the node 16 between the IC2 and the transmission line 10 and a 50 Ω resistor $r_{t2}$ between the transmission line 14 and the system voltage $V_{tt}$. This configuration can significantly reduce the ring-back effect when the IC2 serves as the input end and IC1 serves as the output end. However, since the I/O buffer now includes two resistors $r_{t1}$, $r_{t2}$, it can cause a pull-up effect on the waveform of the data signal at the IC1. The pull-up effect is the name of the phenomenon wherein the rising waveform of the data signal at IC1 rises more rapidly and falls more slowly than normal. Moreover, the additional resistor $r_{t2}$ will cause the overall I/O buffer power consumption to increase. One method to reduce the power consumption is to replace the 50 Ω resistor with one having a larger resistance. However, this solution only stabilizes about 0.1 V of the ripples in the signal waveform that are caused by the ring-back effect. If each IC2 on the circuit board is provided with a 50 Ω resistor, a large area of layout space on the circuit board will be required and the overall power consumption will increase dramatically, thus leading to high manufacturing and operating costs.

SUMMARY OF THE INVENTION

It is therefore an objective of the present invention to provide an I/O buffer with a reduced ring-back effect. This I/O buffer will be suitable for use in conjunction with a data transmission bus, such as a GTL+bus, for the transmission of high-frequency and low-swing data signals. This is done to reduce the ring-back effect in the I/O buffer when the input signal is switched from the high-voltage logic state to the low-voltage logic state.

It is another objective of the present invention to provide an I/O buffer with a reduced ring-back effect. This I/O buffer will be suitable for use in conjunction with a data transmission bus, such as a GTL+bus, for the transmission of high-frequency and low-swing data signals. This is done to reduce the power consumption in the I/O buffer without having to provide an additional resistor for each transmission line.

In accordance with the foregoing and other objectives of the present invention, an I/O buffer with reduced ring-back effect is provided. The I/O buffer of the invention is designed for a data transmission bus, such as a GTL+bus, for the transmission of a high-frequency and low-swing data signal. The I/O buffer of the invention comprises the following constituent elements:

an I/O pad for receiving the data signal from the data transmission bus;

an output transistor having a first end connected to the I/O pad and a second end connected to the ground, wherein the output transistor is switched to a non-conducting state when the I/O buffer operates in the input mode or output high-voltage mode. The output transistor is switched to a conducting state when the I/O buffer operates in the output low-voltage mode;

a signal level detector for detecting the magnitude of the data signal to thereby generate a level-indicating signal of a first logic state if the input signal is higher in magnitude than a preset reference voltage and a second logic state if the input signal is lower in magnitude than the reference voltage;

a resistance regulator, responsive to the level-indicating signal, for generating a resistance-adjusting signal; and a variable-resistance device, wherein a first end is connected to a system voltage equal in magnitude to the high-voltage logic state of the data signal and a second end is connected to the I/O pad; wherein the variable-resistance device can be switched between a preset low resistance value and a near-infinity resistance value in responsive to the resistance-adjusting signal from the resistance regulator in such a manner that the variable-resistance device is switched to the low resistance value when the data signal is greater in magnitude than the reference voltage and to the near-infinity resistance value when the data signal is lower in magnitude than the reference voltage.

Further, the signal level detector comprises an analog comparator for comparing the data signal with the preset reference voltage. The comparator transmits a high-voltage logic signal when the data signal is greater in magnitude than the reference voltage and a low-voltage logic signal when the data signal is lower in magnitude than the reference voltage. The high-voltage logic signal from the comparator causes the resistance regulator to switch the variable-resistance device to the low resistance value. Conversely, the low-voltage logic signal from the comparator causes the resistance regulator to switch the variable-resistance device to the near-infinity resistance value.

The foregoing I/O buffer of the invention can be used in conjunction with a data transmission bus for high-frequency and low-swing operating data signals, such as a GTL+bus. The invention is characterized by the provision of a variable-resistance device that can help reduce the ring-back effect in the I/O buffer. This feature allows the benefits of low power consumption and reduced layout area on the circuit board as compared to the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1:
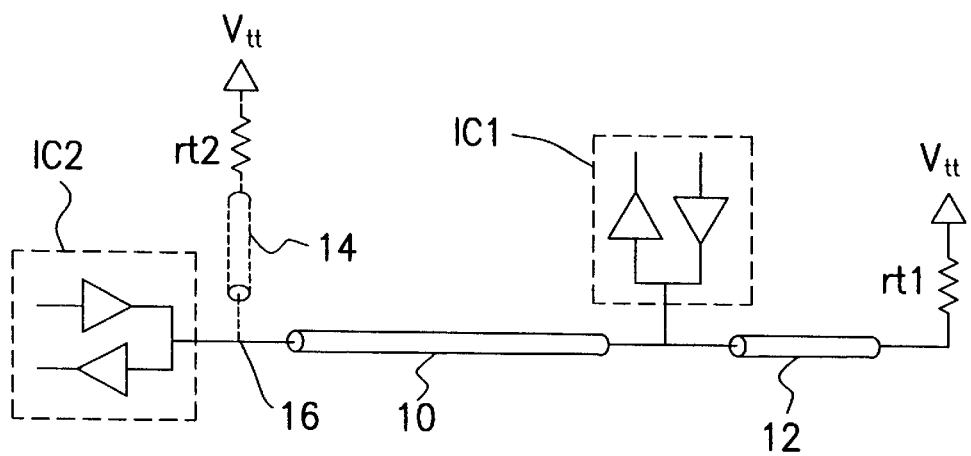
FIG. 1 is a schematic diagram of a conventional GTL+ bus.
Figure 2:
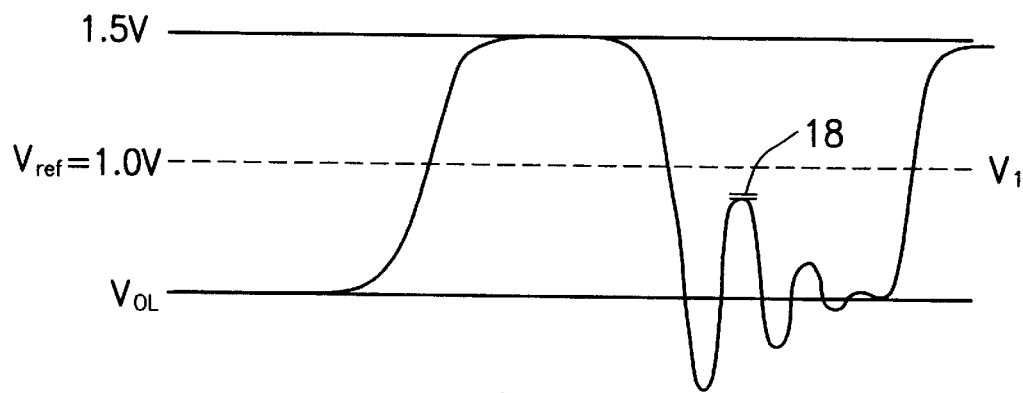
FIG. 2 is a waveform diagram used to show a bounce-back in the waveform of a data signal received by the IC2 shown in FIG. 1 due to ring-back effect.
Figure 3:
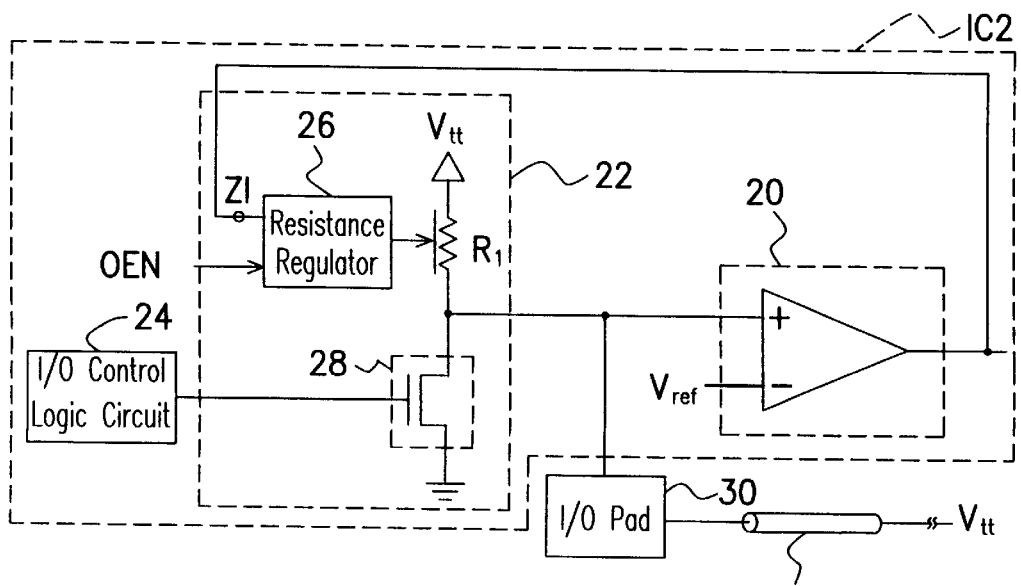
FIG. 3 is a schematic diagram showing the circuit structure of the I/O buffer th reduced ring-back effect according to the invention.

FIG. 3 is a schematic diagram showing the circuit structure of the I/O buffer with reduced ring-back effect according to the invention. The I/O buffer of the invention is specifically designed to serve as the IC2 in FIG. 1 for the purpose of reducing the ring-back effect mentioned in the background section of this specification. This I/O buffer is suitable for use in conjunction with a data transmission bus, such as a GTL+bus, for the transmission of high-frequency and low-swing data signals.

As shown in FIG. 3, the I/O buffer of the invention includes an I/O pad 30, a signal level detector 20 (which also serves as an input buffer), an output buffer 22, and an I/O control logic circuit 24. The output buffer 22 further includes a resistance regulator 26, an output transistor 28, for example an NMOS (N-type metal-oxide semiconductor) transistor, and a variable-resistance device $R_1$ connected between the system voltage $V_{tt}$ and the I/O pad 30.

The system voltage $V_{tt}$ is set to a voltage level equal to the high-voltage logic state of the data signals that are to be received by the I/O buffer, for example 1.5 V. In this embodiment, the signal level detector 20 is an analog comparator having a positive input end (+) connected to the I/O pad 30 and a negative input end (−) connected to a preset reference voltage Vref. The signal level detector 20 generates a level-indicating signal indicating the level of the data signal currently received by the I/O pad 30. The level-indicating signal is, for example, switched to a high-voltage logic state if the current data signal is higher in magnitude than the reference voltage $V_{ref}$, and to a low-voltage logic state if the currently received data signal is lower in magnitude than the reference voltage $V_{ref}$. The level-indicating signal from the signal level detector 20 is fed to the resistance regulator 26. In response to the level-indicating signal from the signal level detector 20 and when enabled by an externally generated output enable signal OEN, the resistance regulator 26 can generate a resistance-adjusting signal to control the resistance of the variable-resistance device $R_1$. In this embodiment, the resistance of the variable-resistance device $R_1$ can be switched from a low resistance value of between 100 and 200 Ω to a near-infinity resistance value (i.e., entirely non-conducting state), and back again.

When the I/O buffer operates in the input mode, the I/O control logic circuit 24 outputs a 0 V control signal to the output transistor 28, causing the output transistor 28 to be switched to the non-conducting state. Similarly, when the I/O buffer operates in the output mode, the output transistor 28 is switched to the conducting state. When operating in the input mode, in the event that the I/O pad 30 receives an input data signal whose magnitude is higher than the reference voltage $V_{ref}$, the signal level detector 20 will output a high-voltage logic signal to the resistance regulator 26, causing the resistance regulator 26 to adjust the variable-resistance device $R_1$ to a low resistance value of between 100 and 200 Ω. As a result, since the system voltage $V_{tt}$ is set to 1.5 V, when the data signal at the I/O pad 30 is stabilized at 1.5 V (the high-voltage logic state) no current will flow through the variable-resistance device $R_1$. This is due to the fact that both ends of the variable-resistance device $R_1$ are now equipotential, resulting in zero power consumption.

In this embodiment, the reference voltage $V_{ref}$ sent to the analog comparator of the signal level detector 20 is set at 1.0 V. Therefore, when the input data signal at the I/O pad 30 is being switched from 1.5 V (i.e., the high-voltage logic state) to below 1.0 V (i.e., the low-voltage logic state), the signal level detector 20 will output a low-voltage logic signal. This signal causes the resistance regulator 26 to adjust the resistance of the variable-resistance device $R_1$ to the near-infinity resistance value, thus allowing the I/O pad 30 to be electrically isolated (in other words, open-circuited) from the system voltage $V_{tt}$. As a result of this, no current can flow through the variable-resistance device $R_1$, resulting in zero power consumption.

Figure 5:
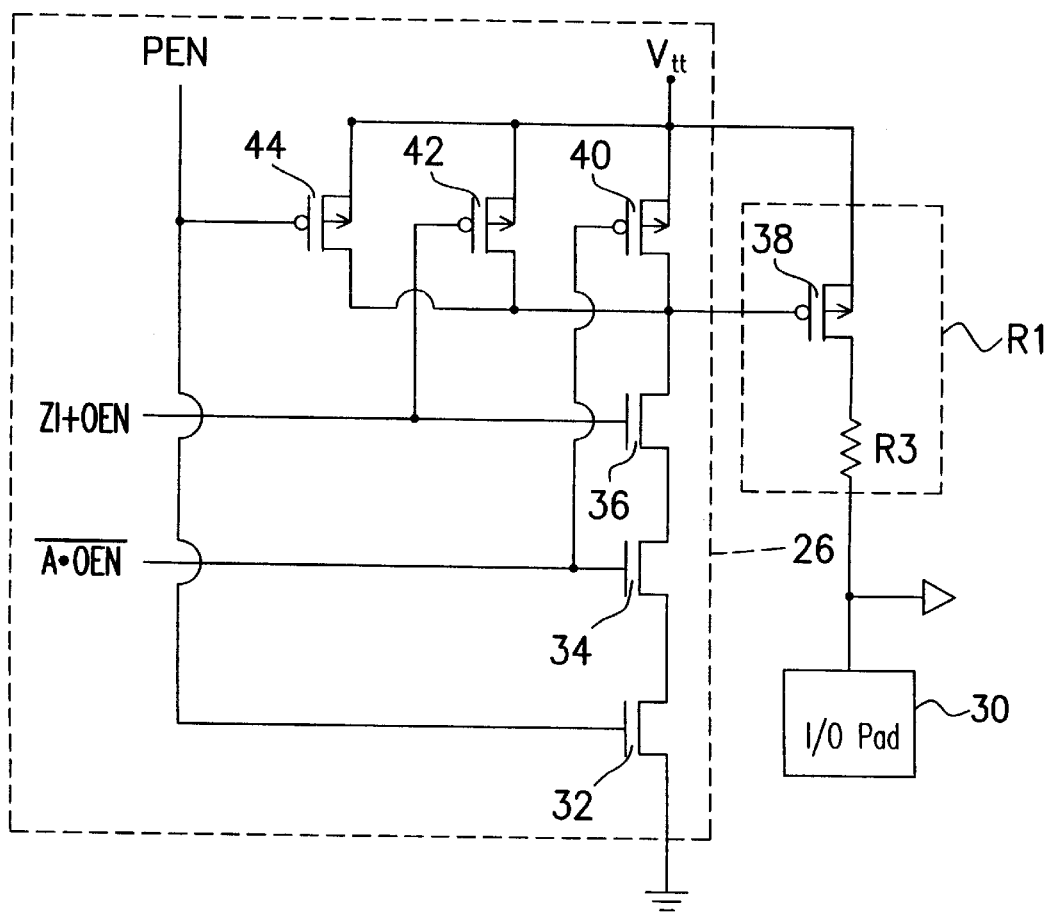
FIG. 5 is a schematic diagram showing detailed circuit structure of the resistance regulator utilized in the I/O buffer of FIG. 3.

As shown in FIG. 5, in this embodiment of the invention, the variable-resistance device $R_1$ can be implemented using a PMOS (P-type metal-oxide semiconductor) transistor 38 connected to a resistor $R_3$. When the I/O pad 30 receives an input data signal of a high-voltage logic state of between 1.0 V and 1.5 V, it will cause the signal level detector 20 to generate a high-voltage logic signal. In response to this high-voltage logic signal, the resistance regulator 26 will generate a 0 V control signal to the gate of the PMOS transistor 38, causing the PMOS transistor 38 to be switched to the conducting state. In the conducting state, the equivalent resistance across the source and drain of the PMOS transistor 38 is about 100 Ω to 200 Ω.

On the other hand, when the I/O pad 30 receives an input data signal of a magnitude below 1.0 V, it will cause the signal level detector 20 to generate a low-voltage logic signal. In response to this low-voltage logic signal, the resistance regulator 26 will generate a high-voltage signal to the gate of the PMOS transistor 38, causing the PMOS transistor 38 to be switched to the non-conducting state. Due the inherent characteristics of the PMOS transistor 38, switching to the non-conducting state requires a transition time of about 5 to 10 ns (nanosecond) to complete. In the conducting state, the equivalent resistance across the source and drain of the PMOS transistor 38 is near-infinity.

Figure 4:
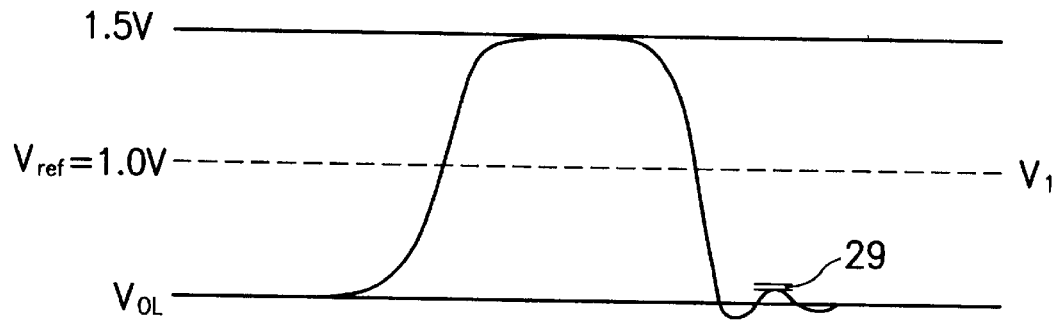
FIG. 4 is a waveform diagram showing the waveform of the data signal received by the I/O buffer of FIG. 3.

The variable-resistance device $R_1$, with its active switching characteristics, can help reduce the ring-back effect to below 0.4 V. As illustrated in FIG. 4, when the input data signal is being switched from 1.5 V (i.e., the high-voltage logic state) to $V_{OL}$ (i.e., the low-voltage state, which is about 0.2 V), the bounce-back at the point 29 due to ring-back effect is only about 0.4 V, which is very close to $V_{OL}$ (0.2 V). Compared to the bounce-back of 0.8 V in the prior art, the invention is clearly more advantageous.

FIG. 5 is a schematic diagram showing detailed circuit structure of the resistance regulator 26 utilized in the I/O buffer of FIG. 3. As shown, the resistance regulator 26 includes three NMOS transistors: a first NMOS transistor 32, a second NMOS transistor 34, and a third NMOS transistor 36; and three PMOS transistors: a first PMOS transistor 40, a second PMOS transistor 42, and a third PMOS transistor 44. The variable-resistance device $R_1$ includes a PMOS transistor 38 and a resistor $R_3$.

The three PMOS transistors 40, 42, 44 are connected in such a manner that all of their sources are connected to the system voltage $V_{tt}$ and all of their drains are connected together to the gate of the PMOS transistor 38 in the variable-resistance device $R_1$. However, the gate of the first PMOS transistor 40 is connected to the gate of the second NMOS transistor 34 and also to the control signals $\overline{A \cdot OEN}$; the gate of the second PMOS transistor 42 is connected to the gate of the third NMOS transistor 36 and also to the control signals ZI+OEN; and the gate of the third PMOS transistor 44 is connected to the gate of the first NMOS transistor 32 and also to the control signal PEN.

The first NMOS transistor 32 is connected in such a manner that its source is connected to the ground; its drain is connected to the source of the second NMOS transistor 34; and its gate is connected to the control signal PEN. The second NMOS transistor 34 is connected in such a manner that its source is connected to the drain of the first NMOS transistor 32; its drain is connected to the source of the third NMOS transistor 36; and its gate is connected to the control signals $\overline{A \cdot OEN}$. The third NMOS transistor 36 is connected in such a manner that its source is connected to the drain of the second NMOS transistor 34; its drain is connected to a node connected to the drains of the three PMOS transistors 40, 42, 44 and the gate of the PMOS transistor 38 in the variable-resistance device $R_1$; and its gate is connected to the control signals ZI+OEN.

The control signal PEN is used for monitoring, and is switched to a high-voltage logic state to enable PMOS transistor 38 function during the operation of the I/O buffer. The control signal OEN is an output enabling signal used to enable the output of this GTL+10 pad buffer. The control signal ZI is the output of the signal level detector 20 shown in FIG. 3.

When it is desired to switch the PMOS transistor 38 to the conducting state i.e., switching the resistance across the variable-resistance device $R_1$ to the low resistance value, all of the NMOS transistors 32, 34, 36 must be switched to the conducting state. When it is desired to switch the PMOS transistor 38 to the non-conducting state, i.e., switching the resistance across the variable-resistance device $R_1$ to the near-infinity resistance value, only one of the NMOS transistors 32, 34, 36 is required to be switched to the non-conducting state. In other words, switching the gate voltage at one of the PMOS transistors 40, 42, 44 to a low-voltage state is sufficient to switch the PMOS transistor 38 to the non-conducting state.

The second PMOS transistor 42 is a weak-type transistor that requires 5 to 10 ns to pull the gate voltage of the PMOS transistor 38 in the variable-resistance device $R_1$ above the threshold voltage and thereby switch the PMOS transistor 38 to the nonconducting state. As a result of this, the resistance across the variable-resistance device $R_1$ is switched to the near-infinity resistance value, preventing current flow and reducing power consumption.

In conclusion, the I/O buffer of the invention can be used in conjunction with a data transmission bus, such as a GTL+bus, for high-frequency and low-swing operating data signals The I/O buffer of the invention is characterized by the provision of a variable-resistance device that reduces the ring-back effect in the I/O buffer. This feature allows the benefits of low power consumption and reduced layout area on the circuit board as compared to the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. An I/O buffer for a data transmission bus for the transmission of a high-frequency and low-swing data signal, comprising:

an I/O pad for receiving the data signal from the data transmission bus;

an output transistor, wherein a first end is connected to the I/O pad and a second end is connected to the ground, the output transistor is switched to the non-conducting state when the I/O buffer operates in an input mode and to the conducting state when the I/O buffer operates in an output mode;

a signal level detector for generating a level-indicating signal of a first logic state if the data signal is higher in magnitude than a reference voltage and a second logic state if the data signal is lower in magnitude than the reference voltage;

a resistance regulator, responsive to the level-indicating signal, for generating a resistance-adjusting signal; and a variable-resistance device, wherein a first end is connected to a system voltage equal in magnitude to the high-voltage logic state of the data signal and a second end is connected to the I/O pad; wherein the variable-resistance device can be switched between a low resistance value and a near-infinity resistance value in response to the resistance-adjusting signal from the resistance regulator, in such a manner that the variable-resistance device is switched to the low resistance value having equal potential at both ends of the variable-resistance device when the data signal is greater in magnitude than the reference voltage, and to the near-infinity resistance value when the data signal is lower in magnitude than the reference voltage.

2. The I/O buffer of claim 1, wherein the signal level detector comprises:

an analog comparator for comparing the data signal with the preset reference voltage, wherein the comparator generates a high-voltage logic signal when the data signal is greater in magnitude than the reference voltage and a low-voltage logic signal when the data signal is lower in magnitude than the reference voltage.

3. The I/O buffer of claim 2, wherein the high-voltage logic signal from the comparator causes the resistance regulator to switch the variable-resistance device to the low resistance value, whereas the low-voltage logic signal from the comparator causes the resistance regulator to switch the variable-resistance device to the near-infinity resistance value.

4. The I/O buffer of claim 3, wherein the low resistance value ranges between 100 and 200 Ω.

5. The I/O buffer of claim 4, wherein the output transistor is an NMOS transistor which has a source connected to the ground, a drain connected to the I/O pad, and a gate controlled by an I/O control signal, the I/O control signal being set at a low-voltage logic state when the I/O buffer operates in the input mode or output high-voltage mode; and at a high-voltage logic state when the I/O buffer operates in the output low-voltage mode.

6. The I/O buffer of claim 5, wherein the variable-resistance device comprises:

a resistor which is a parasitic resistor in POMS drain side has a predetermined resistance and is connected to the I/O pad; and a PMOS transistor having a gate connected to receive the resistance-adjusting signal from the resistance regulator, a source connected to the system voltage, and a drain connected to the resistor.

7. The I/O buffer of claim 6, wherein the resistance of the variable-resistance device is between 100 Ω and 200 Ω.

8. The I/O buffer of claim 1, wherein if the high-voltage logic state of the data signal is 1.5 V, the reference voltage is set at 1.0 V.

9. The I/O buffer of claim 1, wherein the resistance regulator comprises:

at least one PMOS transistor, having a gate connected to the level-indicating signal from the signal level detector, a source connected to the system voltage, and a drain for outputting the resistance-adjusting signal to the variable-resistance device.

10. An I/O buffer for a data transmission bus for the transmission of a high-frequency and low-swing data signal, comprising:

a signal level detector for detecting the magnitude of the data signal to thereby generate a level-indicating signal of a first logic state if the data signal is higher in magnitude than a reference voltage and a second logic state if the data signal is lower in magnitude than the reference voltage;

a resistance regulator, responsive to the level-indicating signal, for generating a resistance-adjusting signal; and a variable-resistance device having a first end connected to a system voltage equal in magnitude to the high-voltage logic state of the data signal and a second end connected to the input end of the I/O buffer; the variable-resistance device being switchable between a low resistance value and a near-infinity resistance value in responsive to the resistance-adjusting signal from the resistance regulator, in such a manner that the variable-resistance device is switched to the low resistance value having equal potential at both ends of the variable-resistance device when the data signal is greater in magnitude than the reference voltage and to the near-infinity resistance value when the data signal is lower in magnitude than the reference voltage.

11. The I/O buffer of claim 10, wherein the signal level detector comprises:

an analog comparator for comparing the data signal with the preset reference voltage, wherein the comparator transmits a high-voltage logic signal when the data signal is greater in magnitude than the reference voltage and a low-voltage logic signal when the data signal is lower in magnitude than the reference voltage.

12. The I/O buffer of claim 11, wherein the high-voltage logic signal from the comparator causes the resistance regulator to switch the variable-resistance device to the low resistance value, whereas the low-voltage logic signal from the comparator causes the resistance regulator to switch the variable-resistance device to the near-infinity resistance value.

13. The I/O buffer of claim 12, wherein the low resistance value ranges between 100 and 200 Ω.

14. The I/O buffer of claim 10, wherein the variable-resistance device comprises:

a resistor which is a parasitic in PMOS drain side has a predetermined resistance and is connected to the input end of the I/O buffer; and a PMOS transistor, which has a gate to receive the resistance-adjusting signal from the resistance regulator, a source connected to the system voltage, and a drain connected to the resistor.

15. The I/O buffer of claim 14, wherein the resistance of the variable-resistance device is between 100 Ω and 200 Ω.

16. The I/O buffer of claim 10, wherein if the high-voltage logic state of the data signal is 1.5 V, the reference voltage is set at 1.0 V.

17. The I/O buffer of claim 10, wherein the resistance regulator comprises:

at least one PMOS transistor having a gate connected to the level-indicating signal from the signal level detector, a source connected to the system voltage, and a drain for outputting the resistance-adjusting signal to the variable-resistance device.

18. The I/O buffer of claim 10, further comprising:

an output transistor having a first end connected to the input end of the I/O buffer and a second end connected to the ground, wherein the output transistor can be switched to the non-conducting state when the I/O buffer operates in the input mode or output high-voltage mode; and to the conducting state when the I/O buffer operates in the output low-voltage mode.

19. The I/O buffer of claim 18, wherein the output transistor is an NMOS transistor which has a source connected to the ground, a drain connected to the input end of the I/O buffer, and a gate connected to an I/O control signal, wherein the I/O control signal is set at a low-voltage logic state when the I/O buffer operates in the input mode or output high-volltage mode; and at a high-voltage logic state when the I/O buffer operates in the output low-voltage mode.

* * * * *